US 6,561,744 B2

(12) United States Patent
Liang

(10) Patent No.: US 6,561,744 B2
(45) Date of Patent: May 13, 2003

(54) WAFER BLADE FOR WAFER PICK-UP FROM A WATER TANK AND METHOD FOR USING

(75) Inventor: Yao Hsiang Liang, Kaohsiung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 74 days.

(21) Appl. No.: 09/927,617

(22) Filed: Aug. 10, 2001

(65) Prior Publication Data
US 2003/0031544 A1 Feb. 13, 2003

(51) Int. Cl.[7] .......................... B65G 49/07; B25J 15/00
(52) U.S. Cl. .......................... 414/416.01; 414/225.01; 414/941; 294/64.1
(58) Field of Search ................ 414/416.01, 225.01, 414/941; 294/64.1

(56) References Cited
U.S. PATENT DOCUMENTS
4,858,975 A * 8/1989 Ogawa ...................... 294/64.1
6,080,046 A * 6/2000 Shendon et al. ............... 451/54
* cited by examiner Primary Examiner—Steven A. Bratlie
(74) Attorney, Agent, or Firm—Tung & Associates

(57) ABSTRACT

A wafer blade for picking up wafers immersed in a wafer tank and a method for using the wafer blade are described. The wafer blade is constructed by a blade body of generally elongated rectangular shape that has a wafer pick-up side and a backside. The wafer pick-up side of the blade body has a recessed vacuum port for contacting a wafer with a vacuum passageway in the blade body connected to an external vacuum source. The backside of the blade body has at least two recessed slots that are open to an edge of the blade body, wherein each has a width of at least 5 mm and a length of at least 5 cm for providing ventilation and preventing the backside of the blade body from sticking to a wafer by capillary reaction caused by water entrapped in between the wafer and the backside of the blade body.

20 Claims, 2 Drawing Sheets

WAFER BLADE FOR WAFER PICK-UP FROM A WATER TANK AND METHOD FOR USING

FIELD OF THE INVENTION

The present invention generally relates to an apparatus for picking up wafers from a water tank and a method for using the apparatus and more particularly, relates to an improved wafer blade for picking up wafers immersed in a water tank that does not have the problem of having a wafer sticking to the backside of the wafer blade due to capillary reaction of water and a method for using the improved wafer blade.

BACKGROUND OF THE INVENTION

Apparatus for polishing thin, flat semi-conduct or wafers is well known in the art. Such apparatus normally includes a polishing head which carries a membrane for engaging and forcing a semi-conductor wafer against a wetted polishing surface, such as a polishing pad. Either the pad, or the polishing head is rotated and oscillates the wafer over the polishing surface. The polishing head is forced downwardly onto the polishing surface by a pressurized air system or, similar arrangement. The downward force pressing the polishing head against the polishing surface can be adjusted as desired. The polishing head is typically mounted on an elongated pivoting carrier arm, which can move the pressure head between several operative positions. In one operative position, the carrier arm positions a wafer mounted on the pressure head in contact with the polishing pad. In order to remove the wafer from contact with the polishing surface, the carrier arm is first pivoted upwardly to lift the pressure head and wafer from the polishing surface. The carrier arm is then pivoted laterally to move the pressure head and wafer carried by the pressure head to an auxiliary wafer processing station. The auxiliary processing station may include, for example, a station for cleaning the wafer and/or polishing head; a wafer unload station; or, a wafer load station.

More recently, chemical-mechanical polishing (CMP) apparatus has been employed in combination with a pneumatically actuated polishing head. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in de-ionized water.

The CMP method can be used to provide a planner surface on dielectric layers, on deep and shallow trenches that are filled with polysilicon or oxide, and on various metal films. A possible mechanism for the CMP process involves the formation of a chemically altered layer at the surface of the material being polished. The layer is mechanically removed from the underlying bulk material. An outer layer is then regrown on the surface while the process is repeated again. For instance, in metal polishing, a metal oxide layer can be formed and removed repeatedly.

During a CMP process, a large volume of a slurry composition is dispensed. The slurry composition and the pressure applied between the wafer surface and the polishing pad determine the rate of polishing or material removal from the wafer surface. The chemistry of the slurry composition plays an important role in the polishing rate of the CMP process. For instance, when polishing oxide films, the rate of removal is twice as fast in a slurry that has a pH of 11 than with a slurry that has a pH of 7. The hardness of the polishing particles contained in the slurry composition should be about the same as the hardness of the film to be removed to avoid damaging the film. A slurry composition typically consists of an abrasive component, i.e, hard particles and components that chemically react with the surface of the substrate. For instance, a typical oxide polishing slurry composition consists of a colloidal suspension of oxide particles with an average size of 30 nm suspended in an alkali solution at a pH larger than 10. A polishing rate of about 120 nm/min can be achieved by using this slurry composition. Other abrasive components such as ceria suspensions may also be used for glass polishing where large amounts of silicon oxide must be removed. Ceria suspensions act as both the mechanical and the chemical agent in the slurry for achieving high polishing rates, i.e, larger than 500 nm/min. While ceria particles in the slurry composition remove silicon oxide at a higher rate than do silica, silica is still preferred because smoother surfaces can be produced. Other abrasive components, such as alumina($Al_3O_2$) may also be used in the slurry composition.

When a wafer surface is planarized by a CMP process, the wafer may have to be transferred between various CMP process stations before the planarization can be completed. During the transfer of the wafer between various CMP stations, the wafers are stored in a wafer storage cassette in a vertical position and the whole cassette is then positioned in a water tank such that the wafers are immersed in water to prevent the slurry solution left on the wafer surface from drying or solidifying. This is an important process step since if the wafers are not stored immersed in water, the solidified particles on the wafer surface becomes a contaminated source and may cause serious scratching of the wafer surface during the subsequent CMP operation.

A cassette tub is normally used for holding at least one wafer cassette, i.e. holding four wafer cassettes, in a tilted position for accessing by a robot blade, as shown in FIGS. 1 and 2. A wafer cassette 10 is positioned in a cassette tub 12 at a tilt angle of about 5.5° as measured from the horizontal plane, i.e. the bottom wall 14 of the tub. A robot arm 16 operating a robot blade 18 is used to pick-up wafers 20 that are stored in the wafer cassette 10. The wafers 20 are positioned in slots (not shown) formed on the interior sidewall of the wafer cassette 10. For instance, the robot blade 18, shown in FIG. 1, is in a pick-up position when the robot lowers the blade.

A typical construction of the conventional robot blade 18 is shown in FIGS. 3A and 3B. FIG. 3A is a plane view of the front side 12, i.e, the wafer pick-up side of the wafer blade 18, while FIG. 3B is a plane view of the backside 14 of the wafer blade 18. As shown in FIG. 3A, the wafer blade 18 is constructed in a generally elongated rectangular shape that has a first thickness of about 2 mm, or in a range between about 1.5 mm and about 3 mm, with a recessed vacuum port 22 that is covered with an elastomeric material layer 24 on top. The recessed vacuum port has an opening 26 that is in fluid communication with a vacuum passageway 28, shown in FIG. 3B. The vacuum passageway 28 is further in fluid communication with a vacuum inlet 30 which is connected to an external vacuum source (not shown).

In the configuration shown for the conventional wafer blade of FIGS. 3A and 3B, the surface 32 of the backside 14 of robot blade 18 is a smooth metal surface (such as a surface of aluminum) such that when the wafer blade 18 reaches into a wafer cassette 10 which is immersed in water to pick up a wafer 20, the backside 14 of the blade can easily stick to another wafer 20 that is situated behind the wafer to be picked up by a capillary reaction of water entrapped between the wafer 20 and the smooth backside surface 32. This is shown in FIG. 2. When such wafer pick-up occurs on the backside of the wafer blade 18, the wafer 20 that is picked up on the backside may fall off the wafer blade 18 as the blade leaves the wafer cassette, i.e. or the water tank, and thus causing the wafer 20 to break or to be seriously damaged.

It is therefore an object of the present invention to provide a wafer blade for picking up wafers that are immersed in a water tank that does not have the drawbacks or shortcomings of the conventional wafer blades.

It is another object of the present invention to provide a wafer blade for picking up wafers immersed in a water tank which does not have the problem of picking up wafers by the backside of the blade.

It is a further object of the present invention to provide a wafer blade for picking up wafers that are stored in a water tank in between polishing stages of a chemical mechanical polishing process.

It is another further object of the present invention to provide a wafer blade for picking up wafers immersed in a water tank that is constructed by a body of generally elongated rectangular shape that has a wafer pick-up side and a backside.

It is still another object of the present invention to provide a wafer blade for picking up wafers immersed in a water tank which is equipped with a recessed vacuum port for contacting a wafer on a wafer pick-up side of the blade.

It is yet another object of the present invention to provide a wafer blade for picking up wafers immersed in a water tank which has at least two recessed slots in the backside of the blade body opening to an edge of the blade body to prevent water entrapment between a wafer and the backside of the blade body.

It is still another further object of the present invention to provide a wafer blade for picking up wafers immersed in a water tank which does not pick up a wafer on the backside of the blade due to capillary reaction of water entrapped between the wafer and the backside of the blade body.

SUMMARY OF THE INVENTION

In accordance with the present invention, a wafer blade for picking up wafers immersed in a water tank and a method for using the wafer blade are discussed.

In a preferred embodiment, a wafer blade for picking up wafers immersed in a water tank can be provided which includes a blade body of generally elongated shape that has a first thickness, a wafer pick-up side and a backside; a recessed vacuum port for contacting a wafer on the wafer pick-up side of the blade body that has a second thickness smaller than the first thickness, the recessed vacuum port is in fluid communication with a vacuum passageway in the blade body connected to an external vacuum source; and at least two recessed slots in the backside of the blade body opening to an edge of the blade body each has a width of at least 5 mm and a length of at least 5 cm for providing ventilation and preventing the backside of the blade body from sticking to a wafer by capillary reaction of water entrapped in between the wafer and the backside of the blade body.

In the wafer blade for picking up wafers immersed in a water tank, the recessed vacuum port may further include an elastomeric layer coated on top for contacting a wafer. Each of the at least two recessed slots may further have a depth of at least 0.2 mm, a width between about 5 mm and about 15 mm, and a length between about 5 cm and about 15 cm. Each of the at least two recessed slots may preferably have a width of about 10 mm and a length of about 10 cm. Each of the at least two recessed slots may have a depth between about 0.2 mm and about 1 mm, or preferably a depth of about 0.5 mm. The first thickness of the blade body may be between about 1.5 mm and about 3 mm, or preferably about 2 mm. The blade body may further include mounting means, such as screw holes for mounting to a robot arm.

The present invention is further directed to a method for picking up a wafer immersed in a water tank by a wafer blade which includes the steps of providing a wafer blade that has a blade body of generally elongated rectangular shape with a first thickness, a wafer pick-up side and a wafer backside, a recessed vacuum port for contacting a wafer on the wafer pick-up side of the blade body that has a second thickness smaller than the first thickness, the recessed vacuum port may be in fluid communication with a vacuum passageway in the blade body that is connected to an external vacuum source, and at least two recessed slots in the backside of the blade body opening to an edge of the blade body each has a width of at least 5 mm and a length of at least 5 cm; contacting the wafer pick-up side of the blade body with a wafer situated in a water tank; activating the external vacuum source and producing a vacuum between the recessed vacuum port and the wafer; and retracting the blade body and removing the wafer from the water tank without a wafer sticking to the backside of the blade body by capillary reaction caused by water entrapped in between the wafer and the backside of the blade body.

The method for picking up a wafer emerged in a water tank by a wafer blade may further include the step of coating the recessed vacuum port with an elastomeric layer for contacting a wafer on the port. The method may further include the step of forming the blade body to a first thickness between about 1.5 mm and about 3 mm, or preferably to a first thickness of about 2 mm. The method may further include the step of forming at least two recessed slots to a depth of at least 0.2 mm, or to a depth of between about 0.2 mm and about 1 mm. The method may further include the step of forming at least two recessed slots to a width between about 5 mm and about 15 mm, and a length between about 5 cm and about 15 cm, or to a width preferably of about 10 mm and a length preferably of about 10 cm. The method may further include the step of forming at least two recessed slots to a depth preferably of about 0.5 mm. The method may further include the step of providing mounting means on the blade body for mounting to a robot arm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an improved wafer blade for wafer pick-up from a water tank. The wafer blade is constructed by a blade body, a recessed vacuum port on the front side of the blade body, and at least two recessed slots on the backside of the blade body.

The blade body of the present invention wafer blade is generally of elongated rectangular shape that has a first thickness between about 1.5 mm and about 3 mm, a wafer pick-up side (or the front side) and a backside of the wafer blade body.

A recessed vacuum port is formed in the wafer pick-up side of the blade body for contacting a wafer thereof. An elastomeric coating may be formed on the recessed vacuum port for easier gripping of the wafer. The recessed vacuum port may have a second thickness that is smaller than the first thickness and is in fluid communication with a vacuum passageway provided in the blade body, which in turn connects to an external vacuum source.

On the backside of the blade body is provided with at least two recessed slots that are open to an edge of the blade body. Each has a width of at least 5 mm and a length of at least 5 cm. At least two recessed slots in the backside of the blade body provides ventilation and prevents the backside of the blade body from sticking to a wafer due to capillary reaction caused by a minute amount of water and trapped in between a wafer and the backside of the blade body.

Figure 1:
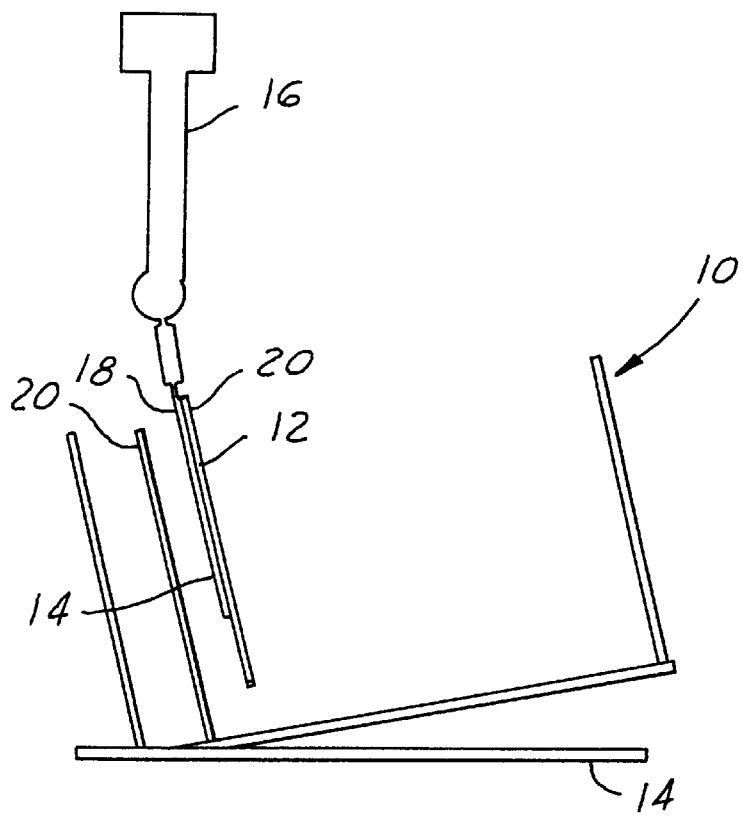
FIG. 1 is a cross-sectional view of a conventional cassette tub that has a wafer cassette situated therein and a robot blade picking up a wafer wherein the cassette is situated at 5.5° from the horizontal plane.
Figure 2:
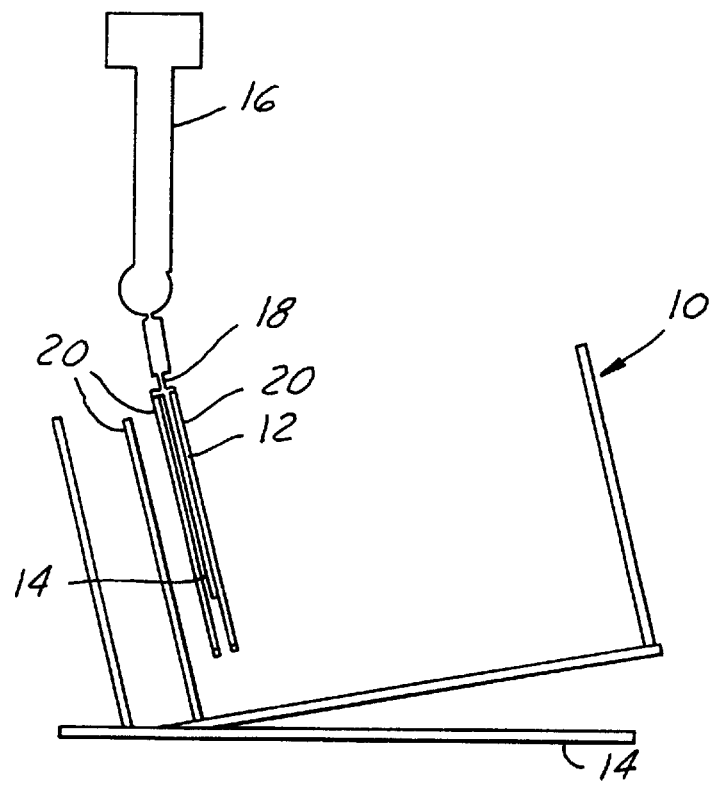
FIG. 2 is a cross-sectional view of the wafer cassette of FIG. 1 with the robot blade picking up a wafer on the front side of the blade while another wafer is sticking to the backside of the blade.
Figure 3A:
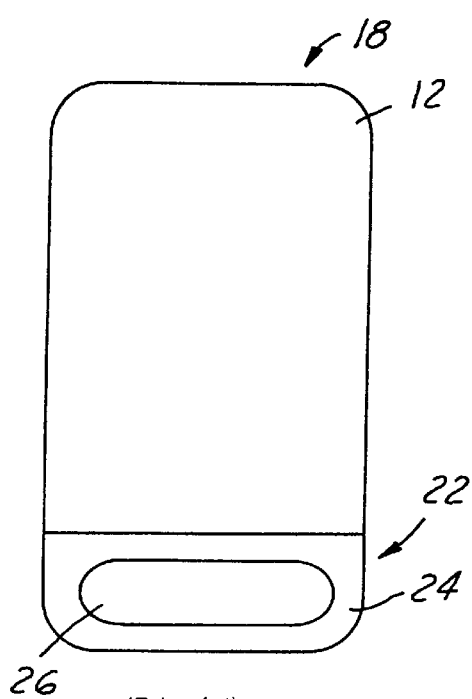
FIG. 3A is a plain view of the front side or the wafer pick-up side of the conventional wafer blade.
Figure 3B:
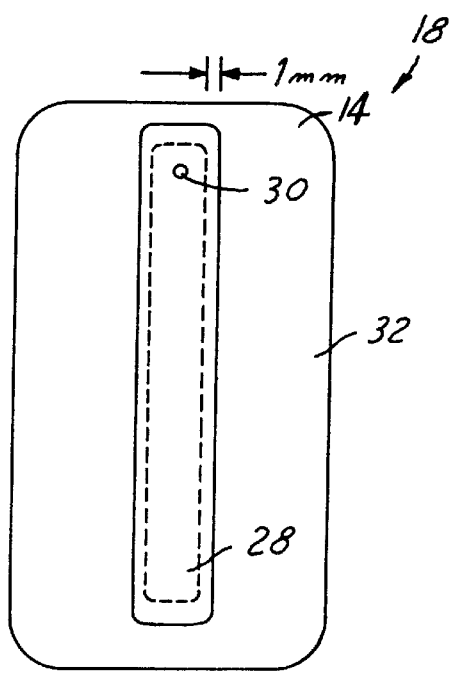
FIG. 3B is a plain view of the backside of the conventional wafer blade illustrating the vacuum channel.
Figure 4A:
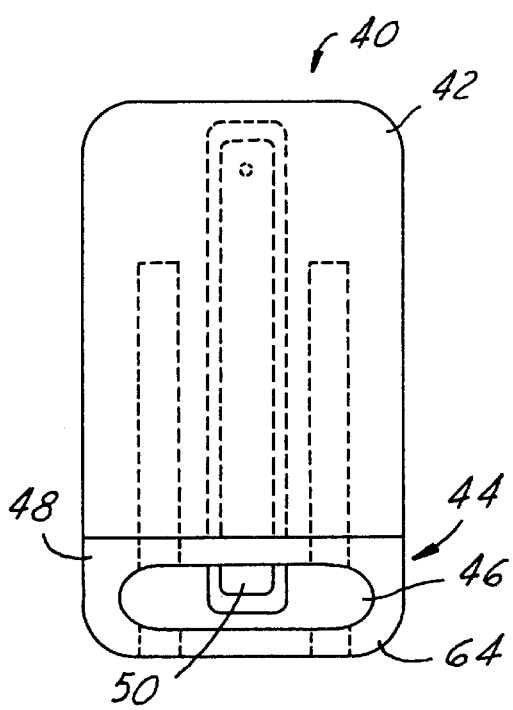
FIG. 4A is a plain view of the front side, or the wafer pick-up side of the present invention wafer blade illustrating the recessed vacuum port.
Figure 4B:
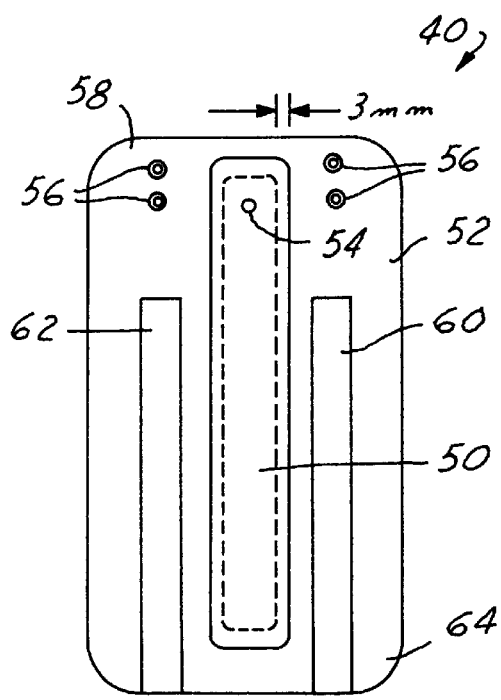
FIG. 4B is a plain view of the backside of the present invention wafer blade illustrating two recessed slots provided on the surface of the wafer backside for ventilation and for preventing water entrapment between a wafer and the blade backside.

Referring now to FIGS. 4A and 4B which show a construction of the present invention wafer blade 40. FIG. 4A is a plain view of the front side 42 of the present invention wafer blade 40 which has a recessed vacuum port 44. The recessed opening 46 has a second thickness which is smaller than a first thickness of the wafer blade 40. The recessed vacuum port 44 is used for contacting a wafer and thus, is preferred to have an elastomeric coating 48 formed on top of the recessed vacuum port 44. The elastomeric coating layer 48 prevents any abrasive damage or scratch to the wafer surface during the pick-up procedure. A vacuum passageway 50 is further shown in FIG. 4A in the recessed vacuum port opening 46, and as ghost lines in other areas of the wafer blade 40

A plain view of the backside 52 of the present invention wafer blade 40 is shown in FIG. 4B. In the backside 52 of the wafer blade 40, at least two recessed slots 60 and 62 are provided in the surface for providing ventilation and preventing the entrapment of a thin layer of water between a wafer and the backside 52 of the wafer blade 40. FIG. 4B further shows the vacuum passageway 50 which is in fluid communication with the recessed vacuum port 44 and a vacuum inlet 54. Mechanical mounting means, i.e., screw holes 56 are further provided on the end 58 that is opposite to the end 64 that has the recessed vacuum port 44.

Since the recessed slots 60, 62 are used to ventilate the backside 52 of the wafer blade 40, and to prevent the entrapment of a thin layer of water in between a wafer and the backside 52 and the subsequent sticking of wafer by capillary reaction, the dimensions of the recessed slots 60, 62 are very important. It was found that a suitable width of the at least two recessed slots is between about 5 mm and about 15 mm, and preferably about 10 mm. A suitable length of the at least two recessed slots 60, 62 may be between about 5 cm and about 15 cm, and preferably at about 10 cm. These dimensions are suitable for a robot blade that is used for picking up a 200 mm diameter wafer. The depth of the at least two recessed slots 60, 62 may be between about 0.2 mm and about 1 mm, and preferably at about 0.5 mm. The blade thickness, i.e., or the first thickness of the blade body is between about 1.5 mm and about 3 mm, and preferably at about 2 mm. When formed at such suitable dimensions, the present invention wafer blade 40 that is provided with the at least two recessed slots 60, 62 provides ventilation and prevents the backside of the blade body from sticking to a wafer by capillary reaction caused by water trapped in between the wafer and the backside of the blade body.

The present invention is further directed to a method for picking up a wafer immersed in a wafer tank by the novel wafer blade described above. The method can be carried out by first providing the novel wafer blade as described above, then contacting the wafer pick-up side of the blade body with a wafer situated in a water tank; then activating the external vacuum source and producing a vacuum between the recessed vacuum port and the wafer; and withdrawing the blade body and removing the wafer from the water tank without a wafer sticking to the backside of the blade body by capillary reaction caused by water trapped in between the wafer and the backside of the blade body.

The present invention novel wafer blade for picking up wafers immersed in a water tank and a method for using the wafer blade have therefore been amply described in the above description and in the appended drawings of FIGS. 4A and 4B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A wafer blade for picking up wafers immersed in a water tank comprising:

a blade body of generally elongated rectangular shape having a first thickness, a wafer pick-up side and a backside;

a recessed vacuum port for contacting a wafer on said wafer pick-up side of the blade body having a second thickness smaller than said first thickness, said recessed vacuum port being in fluid communication with a vacuum passageway in said blade body connected to an external vacuum source; and at least two recessed slots in said backside of the blade body opening to an edge of said blade body each having a width of at least 5 mm and a length of at least 5 cm for providing ventilation and preventing said backside of the blade body from sticking to a wafer by capillary reaction caused by water entrapped in between said wafer and said backside of the blade body.

2. A wafer blade for picking up wafers immersed in a water tank according to claim 1, wherein said recessed vacuum port further comprises an elastomeric layer coated on top for contacting a wafer.

3. A wafer blade for picking up wafers immersed in a water tank according to claim 1, wherein each of said at least two recessed slots has a depth of at least 0.2 mm.

4. A wafer blade for picking up wafers immersed in a water tank according to claim 1, wherein each of said at least two recessed slots has a width between about 5 mm and about 15 mm, and a length between about 5 cm and about 15 cm.

5. A wafer blade for picking up wafers immersed in a water tank according to claim 1, wherein each of said at least two recessed slots preferably has a width of about 10 mm and a length of about 10 cm.

6. A wafer blade for picking up wafers immersed in a water tank according to claim 1, wherein each of said at least two recessed slots has a depth between about 0.2 mm and about 1 mm.

7. A wafer blade for picking up wafers immersed in a water tank according to claim 1, wherein each of said at least two recessed slots has a depth preferably of about 0.5 mm.

8. A wafer blade for picking up wafers immersed in a water tank according to claim 1, wherein said first thickness of the blade body is between about 1.5 mm and about 3 mm.

9. A wafer blade for picking up wafers immersed in a water tank according to claim 1, wherein said first thickness of the blade body is preferably of about 2 mm.

10. A wafer blade for picking up wafers immersed in a water tank according to claim 1, wherein said blade body further comprises mounting means for mounting to a robot arm.

11. A method for picking up a wafer immersed in a water tank by a water blade comprising the steps of:

providing a water blade having a blade body of generally elongated rectangular shape with a first thickness, a wafer pick-up side and a backside; a recessed vacuum port for contacting a wafer on said wafer pick-up side of the blade body having a second thickness smaller than said first thickness, said recessed vacuum port being in fluid communication with a vacuum passageway in said blade body connected to an external vacuum source, and at least two recessed slots in said backside of the blade body opening to an edge of said blade body each having a width of at least 5 mm and a length of at least 5 cm;

contacting the wafer pick-up side of the blade body with a wafer situated in a water tank;

activating the external vacuum source and producing a vacuum between said recessed vacuum port and said wafer; and withdrawing said blade body and removing said wafer from the water tank without a wafer sticking to the backside of the blade body by capillary reaction caused by water entrapped between said wafer and said backside of the blade body.

12. A method for picking up a wafer immersed in a water tank by a wafer blade according to claim 11 further comprising the step of coating said recessed vacuum port with an elastomeric layer for contacting a wafer on the port.

13. A method for picking up a wafer immersed in a water tank by a wafer blade according to claim 11 further comprising the step of forming said blade body to a first thickness between about 1.5 mm and about 3 mm.

14. A method for picking up a wafer immersed in a water tank by a wafer blade according to claim 11 further comprising the step of forming said blade body preferably to a first thickness of about 2 mm.

15. A method for picking up a wafer immersed in a water tank by a wafer blade according to claim 11 further comprising the step of forming said at least two recessed slots to a depth of at least 0.2 mm.

16. A method for picking up a wafer immersed in a water tank by a wafer blade according to claim 11 further comprising the step of forming said at least two recessed slots to a depth of between about 0.2 mm and about 1 mm.

17. A method for picking up a wafer immersed in a water tank by a wafer blade according to claim 11 further comprising the step of forming said at least two recessed slots to a width between about 5 mm and about 15 mm, and to a length between about 5 cm and about 15 cm.

18. A method for picking up a wafer immersed in a water tank by a wafer blade according to claim 11 further comprising the step of forming said at least two recessed slots to a width preferably of about 10 mm and to a length preferably of about 10 cm.

19. A method for picking up a wafer immersed in a water tank by a wafer blade according to claim 11 further comprising the step of forming said at least two recessed slots to a depth preferably of about 0.5 mm.

20. A method for picking up a wafer immersed in a water tank by a wafer blade according to claim 11 further comprising the step of providing mounting means on said blade body for mounting to a robot arm.

* * * * *